United States Patent
Chen et al.

[11] Patent Number: 6,093,600
[45] Date of Patent: Jul. 25, 2000

[54] METHOD OF FABRICATING A DYNAMIC RANDOM-ACCESS MEMORY DEVICE

[75] Inventors: Terry Chung-Yi Chen; Tong-Hsin Lee, both of Taipei Hsien, Taiwan

[73] Assignees: United Silicon, Inc.; United Microelectronics Corp., both of Hsinchu, Taiwan

[21] Appl. No.: 09/430,706

[22] Filed: Oct. 29, 1999

[51] Int. Cl.$^7$ .............................................. H01L 21/8242
[52] U.S. Cl. ............................................ 438/243; 438/386
[58] Field of Search .................................... 438/243, 244, 438/245, 248, 386, 387, 388, 391

[56] References Cited

U.S. PATENT DOCUMENTS

| | | | |
|---|---|---|---|
| 5,378,907 | 1/1995 | Melzner | 257/301 |
| 5,585,303 | 12/1996 | Hong et al. | 438/244 |
| 5,942,778 | 8/1999 | Oikawa | 257/301 |
| 5,973,346 | 10/1999 | Pan | 257/303 |
| 6,018,177 | 1/2000 | Chi | 257/303 |

*Primary Examiner*—Charles Bowers
*Assistant Examiner*—Jack Chen
*Attorney, Agent, or Firm*—Charles C.H. Wu; Charles C.H. Wu & Associates, APC

[57] ABSTRACT

A method of fabricating a dynamic random-access memory (DRAM) device integrates a shallow trench isolation (STI) process and a storage node process into the fabrication of the DRAM device. With a bit line over capacitor (BOC) structure, the capacitor is laid out in parts of the shallow trench isolation structure to increase the surface area of the storage node by using the trench. During the fabrication of the capacitor, a stacked plug used to connect the bit line is formed. The stacked plug used as the interconnection in the circuit region is also formed. An insulating layer is formed to cover the capacitor, and an opening is formed therein to expose the stacked plug. A bit line and an interconnection are formed on the insulating layer to connect with a conducting layer which is located in the stacked plug and contacted with the source/drain regions.

10 Claims, 12 Drawing Sheets

METHOD OF FABRICATING A DYNAMIC RANDOM-ACCESS MEMORY DEVICE

BACKGROUND OF THE INVENTION

1. Field of the Invention

This invention relates to integrated circuit (IC) fabrication technology, and more particularly, to integrate the shallow trench isolation (STI) process and the storage node process into the fabrication of a dynamic random-access memory (DRAM) device.

2. Description of Related Art

In IC fabrication, the primary goal is to make the resulting IC device as highly integrated as possible. To achieve this goal, the various semiconductor components in the IC device should be sized as small as possible in accordance with the design rules. In the case of DRAM, however, the downsizing of the device would also reduce the size of its data storage capacitor, and hence reduce the capacitance of the capacitor, resulting in a reduced data retaining capability of the capacitor. A DRAM capacitor with a smaller capacitance would require more frequent refreshing of the data stored therein, and thus would be more power consumptive and less reliable to operate.

Presently, in order to enhance the capacitance in the gradually reducing of the substrate area occupied DRAM, many 3-dimensional types of capacitors with complicated structure have been proposed to increase the capacitance of the DRAM capacitor. However, the more complicated the capacitor structure is, the higher the capacitor is. Therefore, the capacitor-over-bit line (COB) layout is often used in the fabrication of the storage node, so that the capacitor is not limited by space.

However, the COB structure makes the height of the memory region higher than the peripheral circuit region. Therefore, the planarization process of the oxide layer covering the capacitor is more complicated. Moreover, the capacitor in the memory cell region is formed after the conducting plug in the peripheral circuit region is formed and the oxide layer on the conducting plug is planarized. Therefore, the contact opening/via opening in the peripheral circuit region have higher aspect ratios, so that the etching of the contact opening/via opening and the deposition of metal are more difficult. Moreover, the subsequent metal line process is more difficults too.

SUMMARY OF THE INVENTION

Therefore, the shallow isolation process and storage node process are integrated into the fabrication of a DRAM device in the present invention, and the bit line-over-capacitor (BOC) structure is used to reduce the height difference between the memory cell region and peripheral circuit region.

The method of fabricating DRAM is provided to reduce the difficulty of the planarization process in a memory region and peripheral circuit region, in order to increase the surface area of the storage node.

The method of fabricating DRAM is provided to reduce the aspect ratio of the contact opening/via opening in a peripheral circuit region, so as to enhance the reliability of the metal interconnection process.

In accordance with the foregoing and other objectives of the present invention, a new semiconductor fabrication method is provided for fabricating a capacitor electrode structure in a DRAM device. By the method of the invention, a substrate with a pad oxide layer and a mask layer formed thereon is provided. A trench is formed in the mask layer, the pad oxide layer and the substrate. A liner oxide layer is formed over the surface of the substrate in the trench. A conformal liner layer is formed over the liner oxide layer, wherein the material of the conformal liner layer is different from that of the liner oxide layer. An insulating plug is formed to fill the trench. Parts of the conformal liner layer and the mask layer are removed so that a gap exists between the liner oxide layer and the insulating plug, that is, a distance exists between a upper portion of the conformal liner layer and the surface of the substrate. A substantially conformal first insulating layer is formed to fill the gap, wherein the material of the first insulating layer is different from that of the conformal liner layer. Parts of the first insulating layer and the pad oxide layer are removed until the substrate is exposed. A word line and two source/drain regions are formed, wherein the word line is surrounded by an insulating material, the source/drain regions are located beside the word line in the substrate, and the depth of the source/drain regions is greater than the distance between the upper portion of the conformal liner layer and the surface of the substrate. A second insulating layer with planarized surface over the word line is formed, and first and second openings are formed in the second insulating layer to expose the source/drain regions, respectively, wherein the depth of the first opening reach to the bottom of the trench. A substantially conformal third insulating layer is formed, in which the material of the third insulating layer is different from the conformal liner layer, and parts of the third insulating layer are removed until the substrate is exposed. A substantially conformal first conducting layer is formed and a conformal dielectric layer is formed over the first conducting layer. A second conducting layer is formed over the dielectric layer to fill the first opening and the second opening. The second conducting layer, the dielectric layer and the first conducting layer are patterned to form a capacitor corresponding to the region of the first opening, and a stacked plug is formed in the second opening at the same time. A fourth insulating layer is formed over the capacitor and the stacked plug. The fourth insulating layer is patterned to form a third opening therein to expose the first conducting layer of the stacked plug. A wiring line is formed on the fourth insulating layer to connect the first conducting layer of the stacked plug.

Furthermore, the wiring line formed on the third insulating layer comprises a bit line in the memory cell region and interconnection in the circuit. The capacitor is under the bit line.

Because the shallow isolation process and the storage node process are integrated into the fabrication of the DRAM device with the BOC structure, the DRAM process in this invention is simplified and the height difference between the memory cell region and the peripheral circuit region is reduced. The planarization process in memory cell region and peripheral circuit region is easier. Moreover, the aspect ratio of contact opening/via opening in a circuit region can be reduced, to enhance further the reliability of metal interconnection process. The surface area of the storage node is increased to enhance the capacitance of the capacitor.

BRIEF DESCRIPTION OF DRAWINGS

While the specification concludes with the claims particularly pointing out and distinctly claiming the subject matter regarded as the invention, the objects and features of the invention and further objects, features and advantages thereof will be better understood from the following description taken in connection with the accompanying drawings, in which:

FIGS. 1A–1K are schematic, cross-sectional drawings representing the fabrication steps for forming a capacitor electrode structure in a DRAM device in accordance with the preferred embodiment of the present invention.

DETAILED DESCRIPTION OF PREFERRED EMBODIMENTS

A preferred embodiment of the method according to the invention for fabricating a capacitor electrode structure for a trench type of capacitor in a DRAM device is disclosed in full detail in the following with reference to FIGS. 1A–1K. In the invention the shallow trench process and the storage node process are integrated into the fabricating of DRAM device. The drawings FIGS. 1A–1K and the following description illustrates the fabricating process of a DRAM device in a memory region.

Figure 1A:
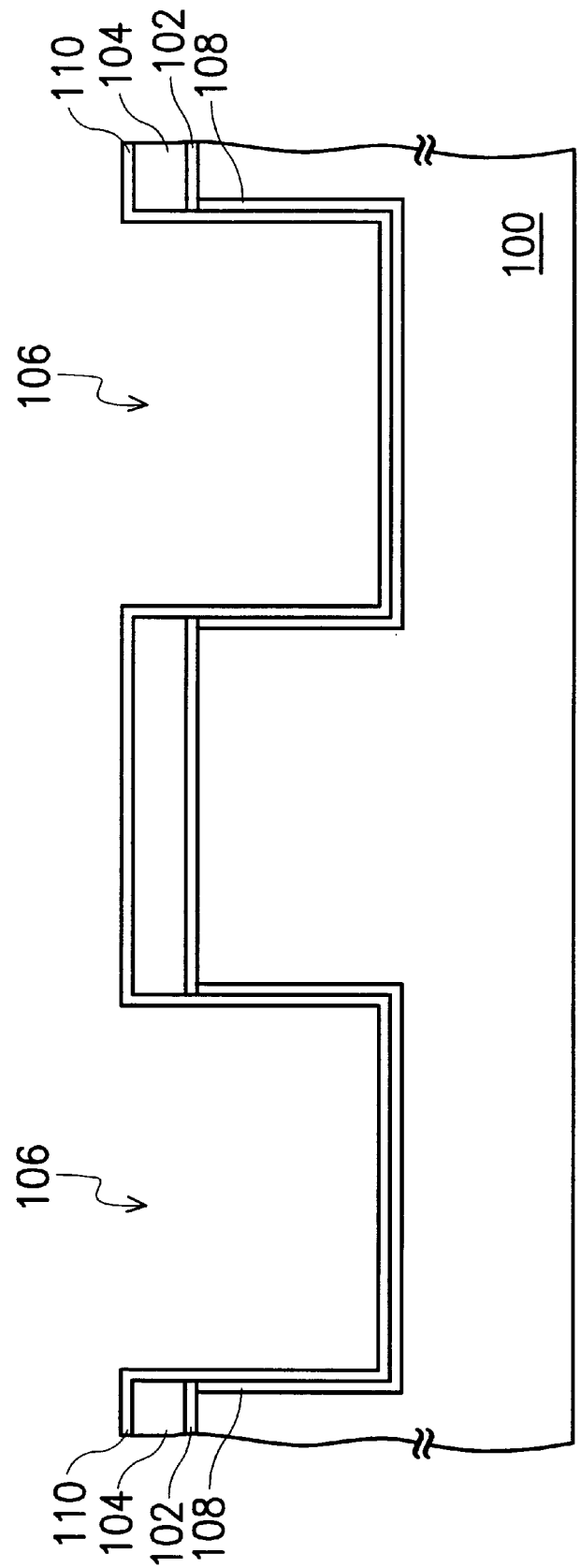

Referring to FIG. 1A, a substrate 100, such as a semiconductor silicon substrate, is provided. A pad oxide layer 102, which is formed by a process such as thermal oxidation, and a mask layer 104 having a material such as silicon nitride are sequentially formed on the substrate 100. A trench 106 is formed in the mask layer 104, the pad oxide layer 102 and the substrate 100 by using photoresist to define the active region. A liner oxide layer 108, which is formed by a process such as thermal oxidation, is formed on the surface of the substrate 100 in the trench 106 and joins the pad oxide layer 102 at a top edge of the trench 106. A conformal liner layer 110, preferably made from silicon nitride, is formed to cover the mask layer 104 and the liner oxide layer 108. The conformal liner layer 110 is used as a stop layer during the subsequent formation of the storage node contact opening.

Figure 1B:
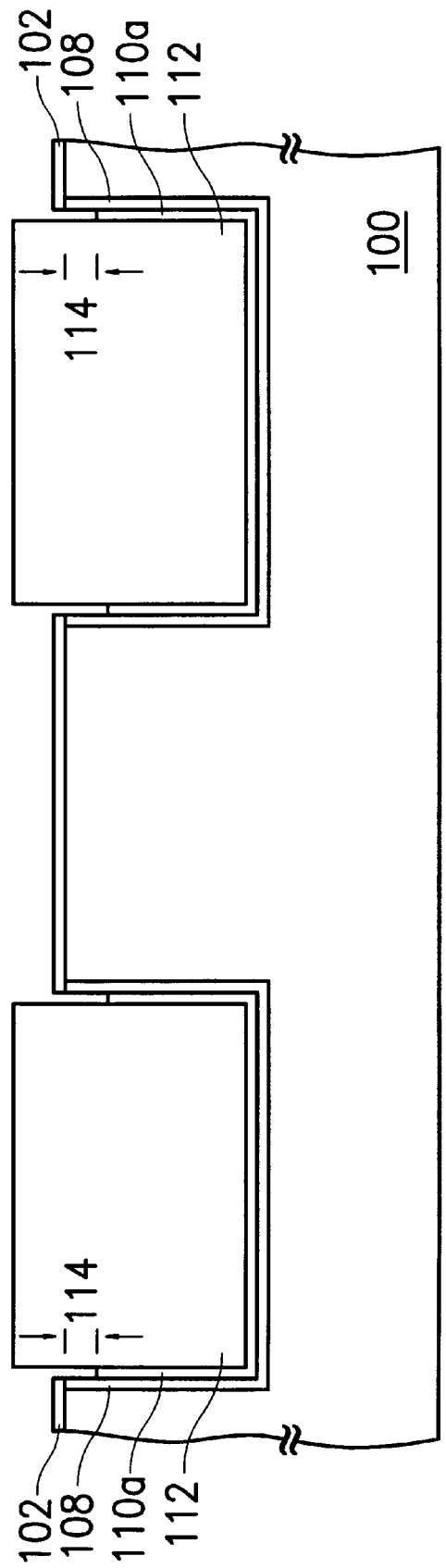

Referring to FIG. 1B, an insulating layer, preferably made from oxide, is formed over the conformal liner layer 110 to fill the trench 106. The unwanted part of the insulating layer is removed to form an insulating plug 112 in the trench 106. The mask layer 104 and parts of the conformal liner layer 110 are removed to expose the pad oxide layer 102. At the same time, the liner oxide layer 108 is also partial exposed. Therefore, the conformal liner layer 110 is transferred into the conformal liner layer 110a as shown in FIG. 1B, and a gap is formed between the insulating plug 112 and the liner oxide layer 108. A distance 114, that is the depth of the gap, exists between a upper portion of the conformal liner layer 110a and a surface of the substrate 100. It is worth noted that the distance 114 must smaller than the depth of the source/drain region subsequently formed.

Figure 1C:
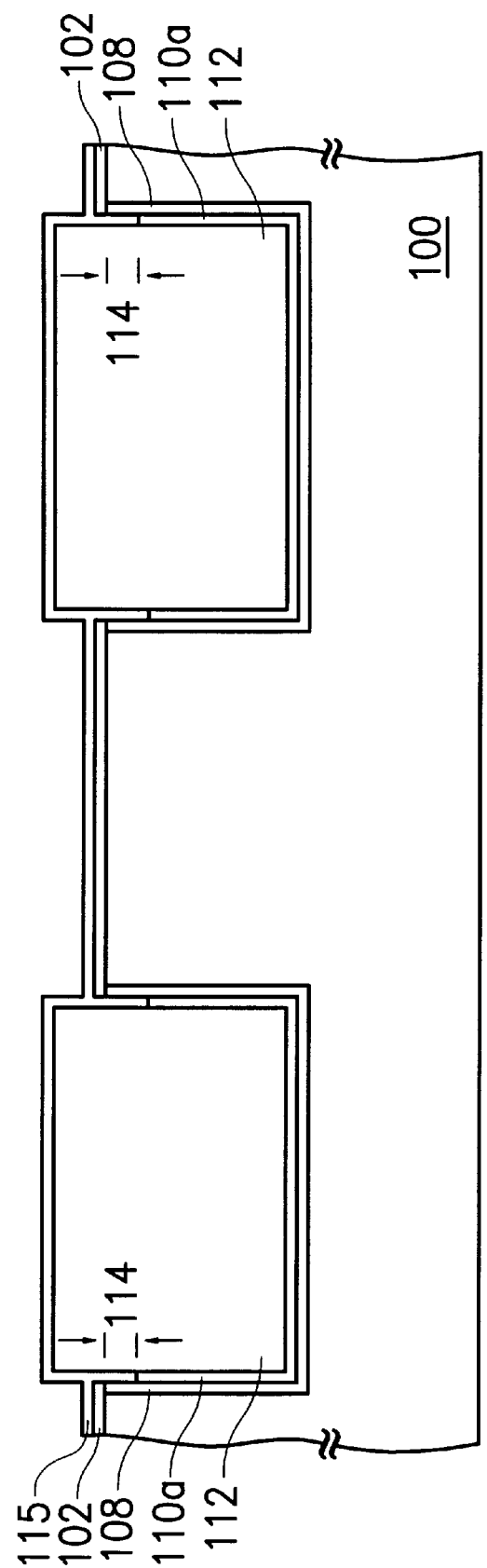

Referring to FIG. 1C, a substantially conformal insulating layer 115 is formed over the entire top surface of the wafer, covering all the currently formed components on the substrate 100. The material of the conformal insulating layer 115, preferably made from oxide, must different from the conformal liner layer 110a. The conformal insulating layer 115 is used to fill the gap between the insulating plug 112 and the liner oxide layer 108, in order to prevent a conducting material deposited subsequently from filling the gap.

Figure 1D:
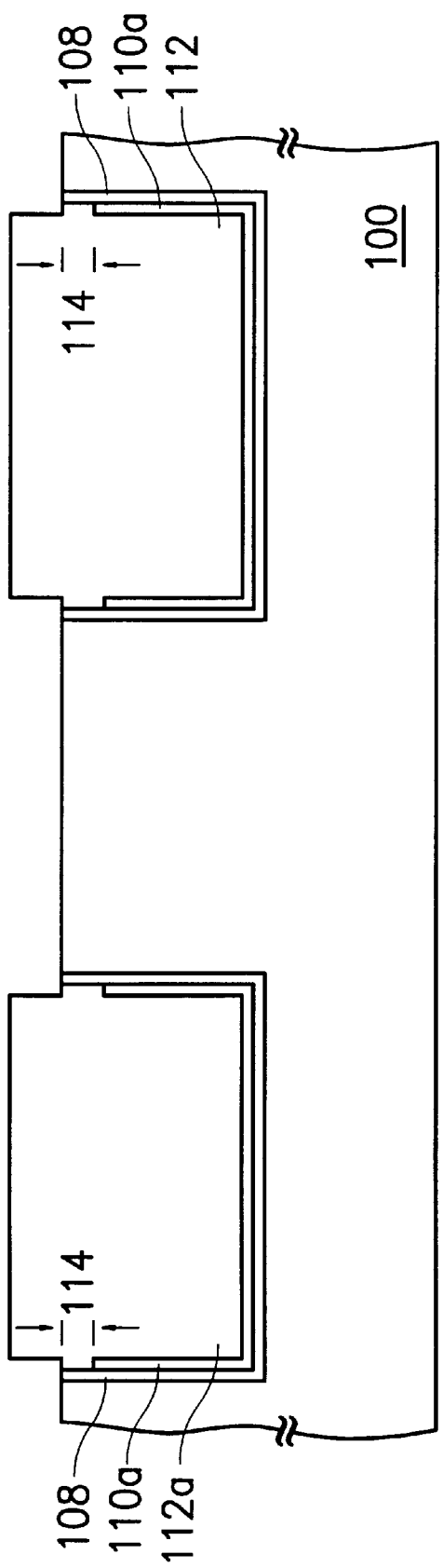

Referring to FIG. 1D, the redundant insulating layer 115 and pad oxide layer 102 are removed by a process such as wet etching, to expose the surface of the substrate 100. A small portion of the insulating plug 112 may also be removed, but it does not affect this invention. The residual part of the insulating layer 115 and the insulating plug 112 are called as insulating plug 112a hereafter.

Figure 1E:
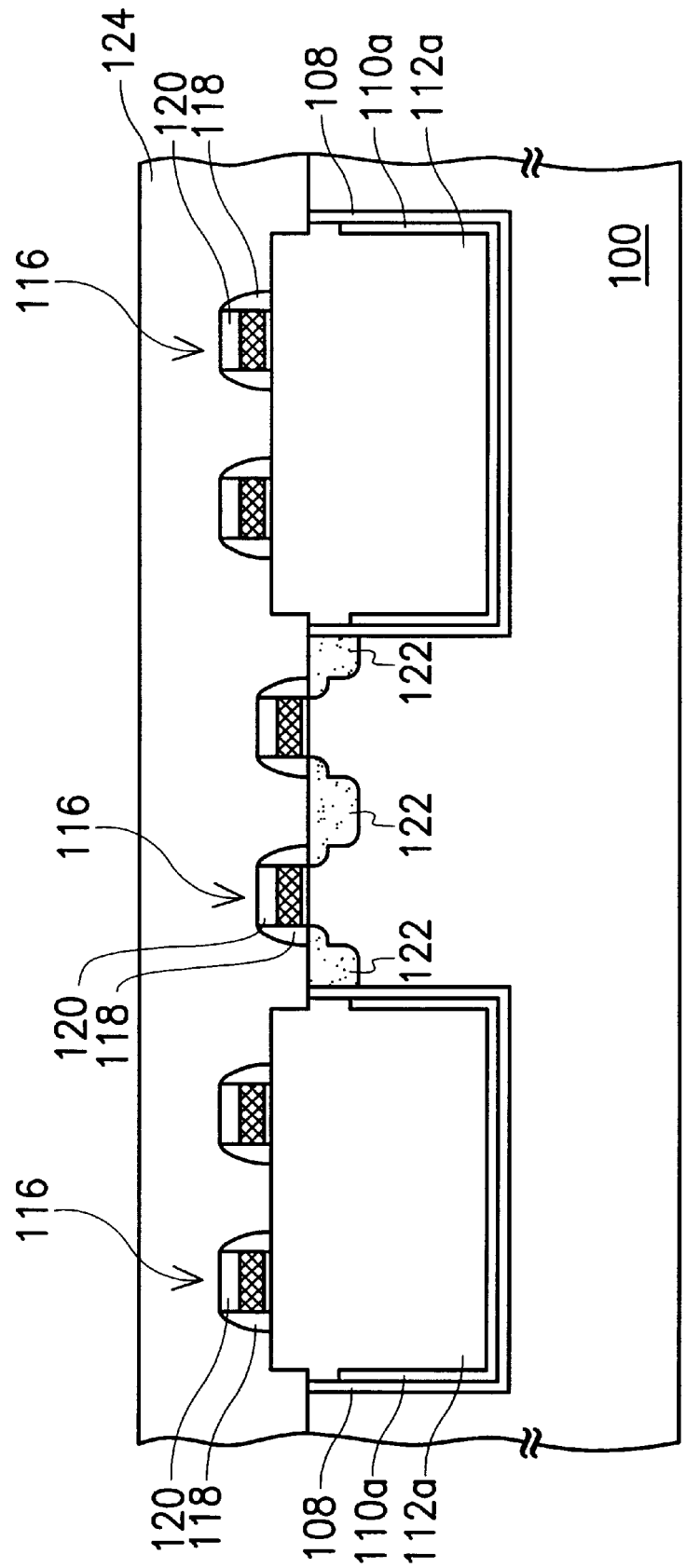

Referring to FIG. 1E, the word line 116, surrounded by a spacer 118 and a cap layer 120 which are formed from an insulating material such as silicon nitride, is formed on the substrate 100. Two source/drain regions 122 are formed in the substrate 100 beside the word line 116 in the active region. An insulating layer 124, having been planarized by a process such as chemical mechanical polishing, is formed to cover the word line 116.

Figure 1F:
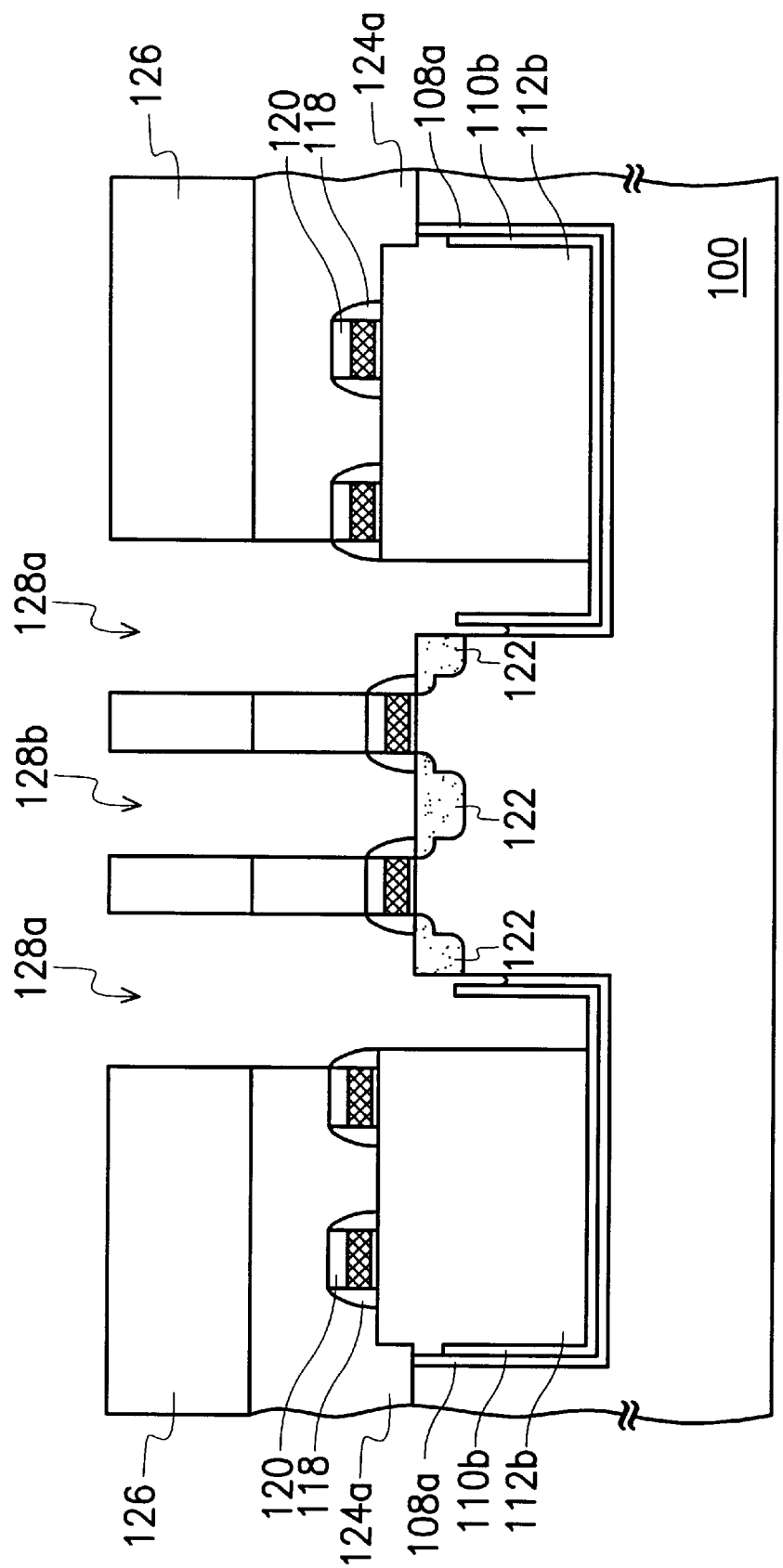

Referring to FIG. 1F, a patterned photoresist layer 126 is coated over the insulating layer 124; the patterned photoresist layer 126 exposes the area in which a contact opening is subsequently to be formed. Using the patterned photoresist layer 126 as a mask, and with the assistance of the spacer 118 and the cap layer 120 surrounding with the word line 116, the insulating layer 124, insulating plug 112a and parts of the liner oxide layer 108 are etched and transformed into insulating plug 124a, insulating plug 112b and liner oxide layer 108a to form the contact openings 128a and 128b therein. Parts of the source/drain regions 122 in the sidewall of the trench 106 are also exposed. The contact opening 128a is the storage node contact opening, and the contact opening 128b is the contact opening of the bit line. The contact opening in the peripheral circuit region is formed with the contact opening of the bit line in the memory cell region, but not shown in the figures.

Figure 1G:
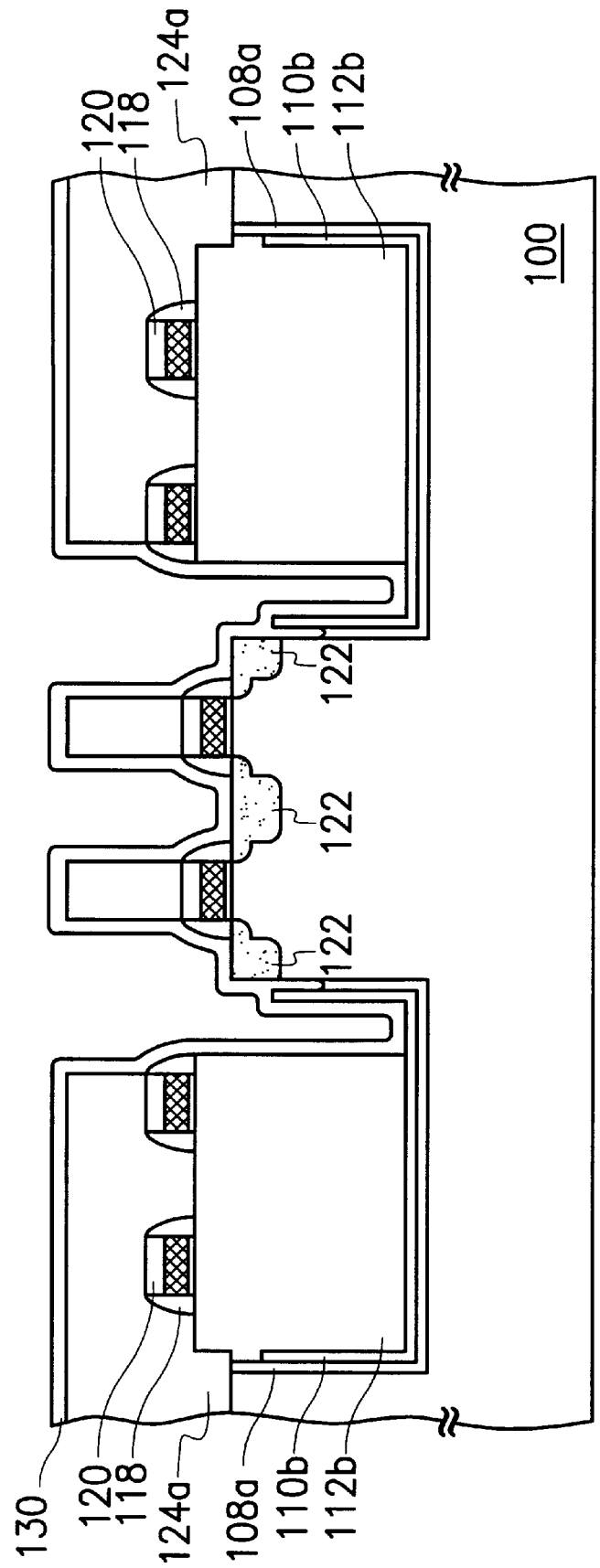

During the formation of the contact openings 128a and 128b, the liner oxide layer 108 between the substrate 100 and the conformal liner layer 110a is partially removed also, and a gap is formed therebetween. Referring to FIG. 1G, in order to fill the gap, after removing the patterned photoresist layer 126, a substantially conformal insulating layer 130, preferably made from oxide, is formed to cover the whole wafer.

Figure 1H:
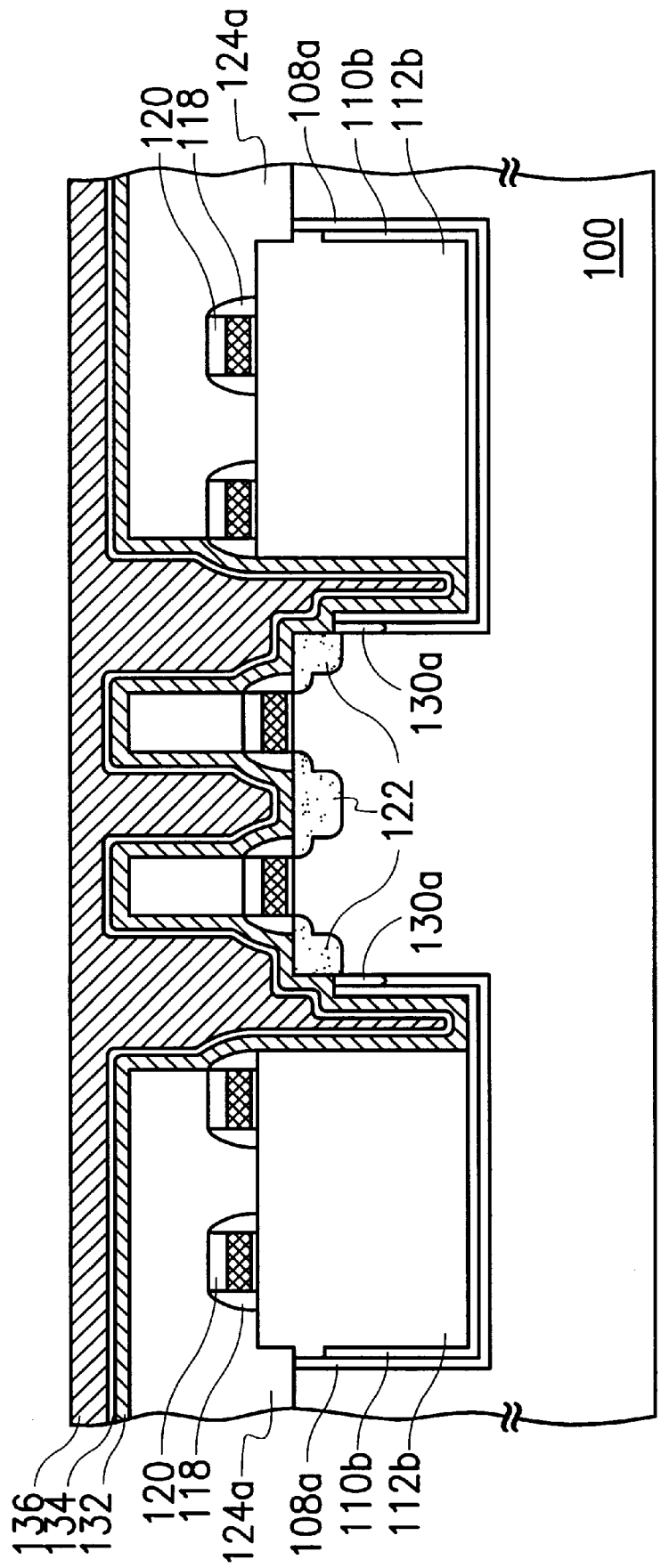
Figure 11:
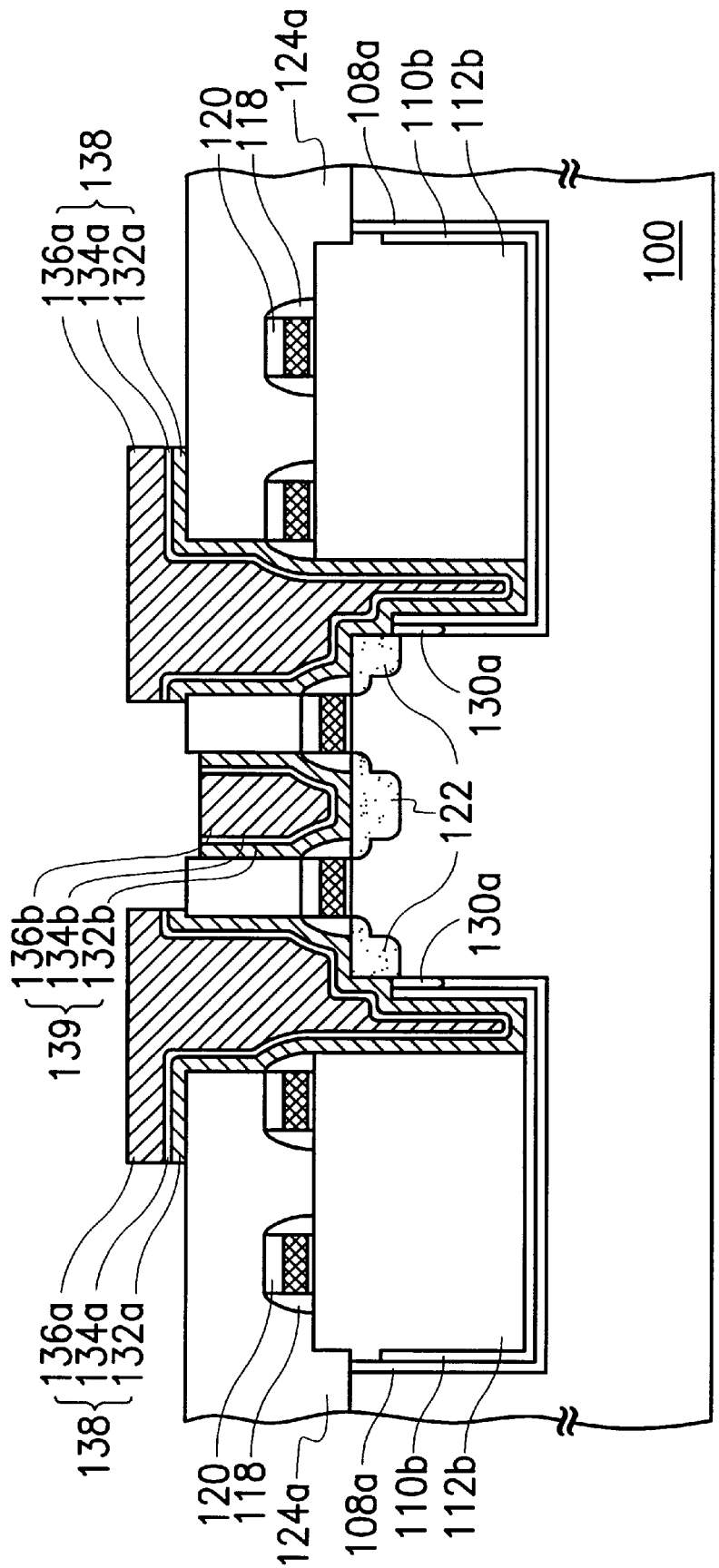

Referring to FIG. 1H, parts of the insulating layer 130 are removed to fill only the gap between the substrate 100 and the conformal liner layer 110a, and insulating layer 130 is transformed into an insulating layer 130a as shown. Next, a substantially conformal conducting layer 132, preferably made from doped polysilicon, is formed over the entire top surface of the wafer, covering all the currently formed components over the substrate 100, to fill the gap and to connect the source/drain regions. The conducting layer 132 substantially located in the storage node contact opening 128a is used for the storage node of the capacitor, and the conducting layer 132 substantially located in the contact opening 128b is used for the connection of the bit line formed subsequently. A conformal dielectric layer 134, used for the dielectric layer of the capacitor, is formed over the conducting layer 132. A conducting layer 136, preferably made from doped polysilicon, is formed over the conformal dielectric layer 134 and fills the contact opening 128a and 128b. The conducting layer 136 is used for the upper electrode of the capacitor.

Referring to FIG. 1I, the conducting layer 132, dielectric layer 134 and conducting layer 136 are patterned to form the conducting layer (that is storage node) 132a, the dielectric layer 134a and the conducting layer 136a, and the conducting layer 132b, the dielectric layer 134b and the conducting layer 136b. The method is such as a patterned photoresist layer (not shown) is covered on parts of the conducting layer 136 which will form a capacitor, then the etching process is performed. The conducting layer 132a, the dielectric layer 134a and the conducting layer 136a substantially correspond to contact opening 128a and are used as the capacitor 138 of the DRAM. The conducting layer 132b, the dielectric layer 134b and the conducting layer 136b substantially correspond to contact opening 128b and construct a stacked plug 139. However, the dielectric layer 134b and the conducting layer 136b are used to fill the space of the contact opening 128b. Moreover, the upper surface of the capacitor 138 is higher the upper surface of the stacked plug 139.

Because the depth of the capacitor 138 reaches the bottom of the trench 106 in the substrate 100, the storage node 132a of the capacitor 138 can have a larger surface area to gain higher capacitance. Therefore, the distance from the top of the capacitor 138 to the surface of the substrate 100 in this invention is smaller than that of the 3-dimensional types of capacitor with complicated structures in prior art. The height difference between the memory cell region and the peripheral circuit region almost does not exist, so that the planarization process is easily controlled. As a result, the planarization in the memory cell region and the peripheral circuit region is enhanced.

Figure 1J:
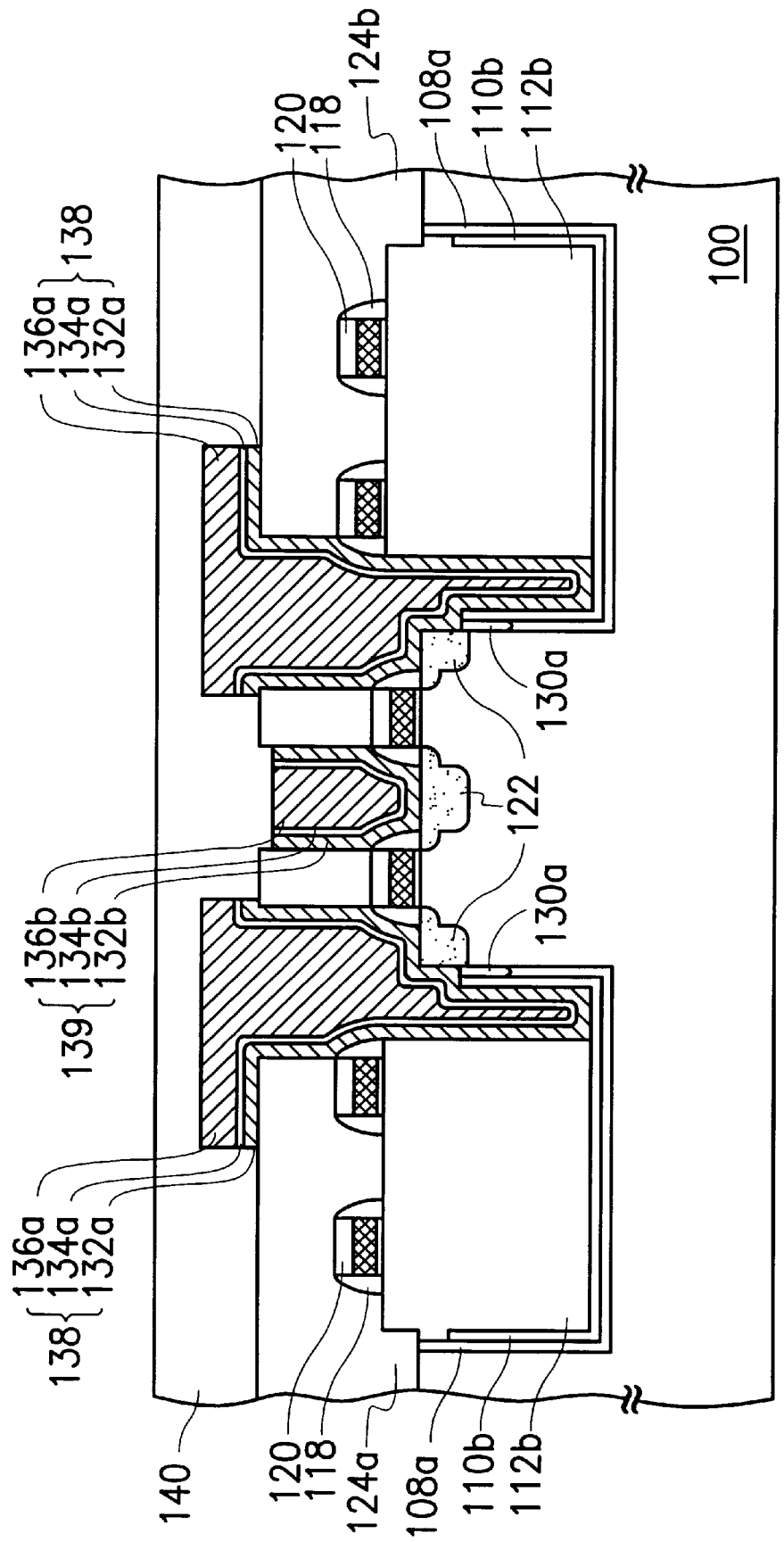

Referring to FIG. 1J, an insulating layer 140, preferably made from oxide, with a planarized surface, is formed to cover the conducting layer 136a and 136b and insulating layer 124a.

Figure 1K:
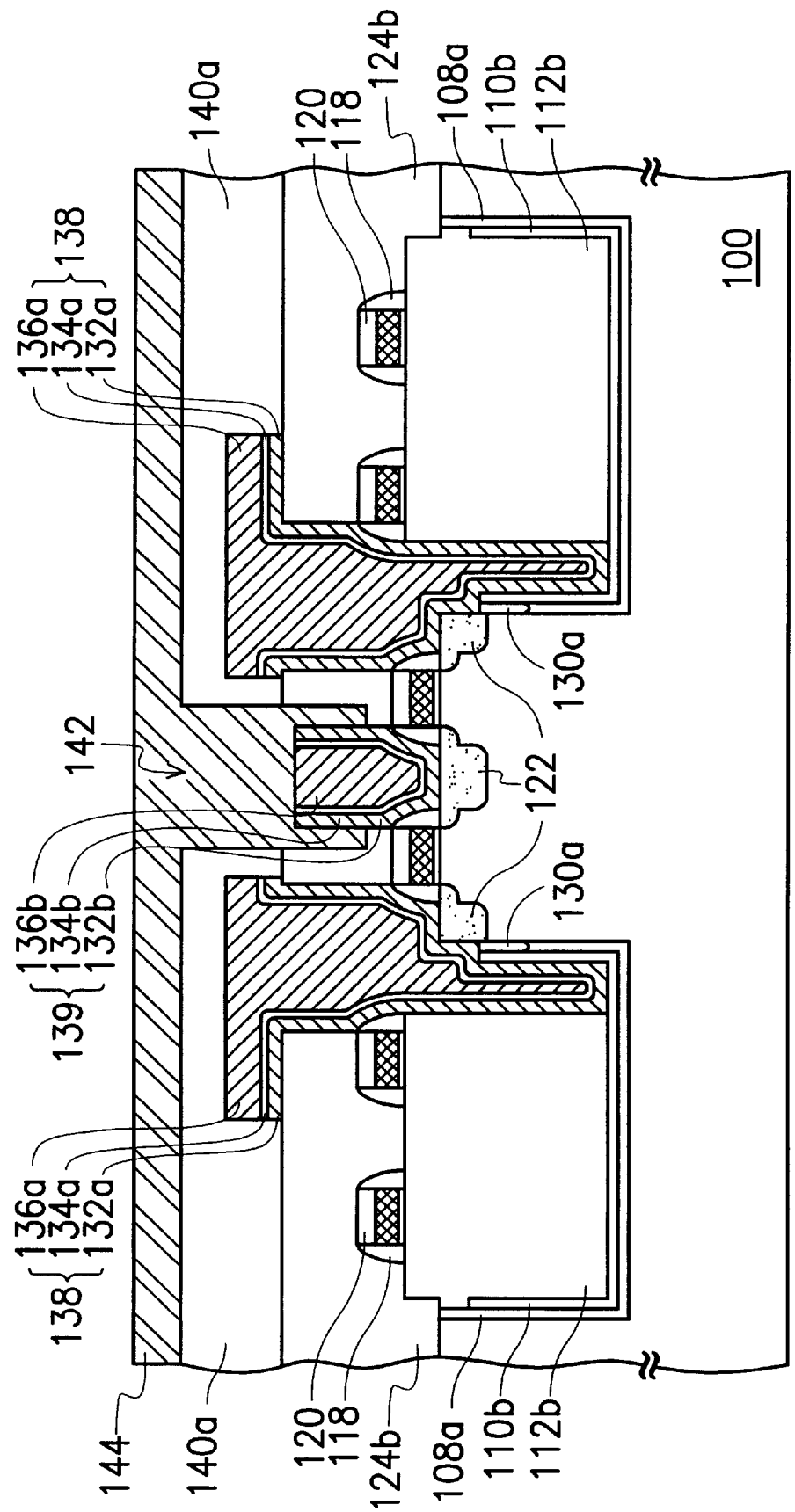

Referring to FIG. 1K, the insulating layer 140 and 124a are patterned and transformed into insulating layer 140a and 124b to form an opening 142 therein. It is worth noted that the depth of the opening 142 also can reach the cap layer 120 and using the cap layer 120 as an etching stop layer during the etching process of the opening 142. The opening 142 exposes parts of the conducting layer 132b, as well as parts of the conducting layer 136b and the dielectric layer 134b. Next, a bit line 144 is formed on the insulating layer 140a to connect with the conducting layer 132b, and the source/drain regions 122 can be controlled by the bit line 144. The bit line 144 is formed by, for example, forming a conducting layer, preferably made from doped polysilicon, over the insulating layer, and then patterning the conducting layer to form the bit line 144. Furthermore, the interconnection process in the peripheral circuit region is performed with the bit line process, and the methods are the same as those mentioned above.

Figure 2:
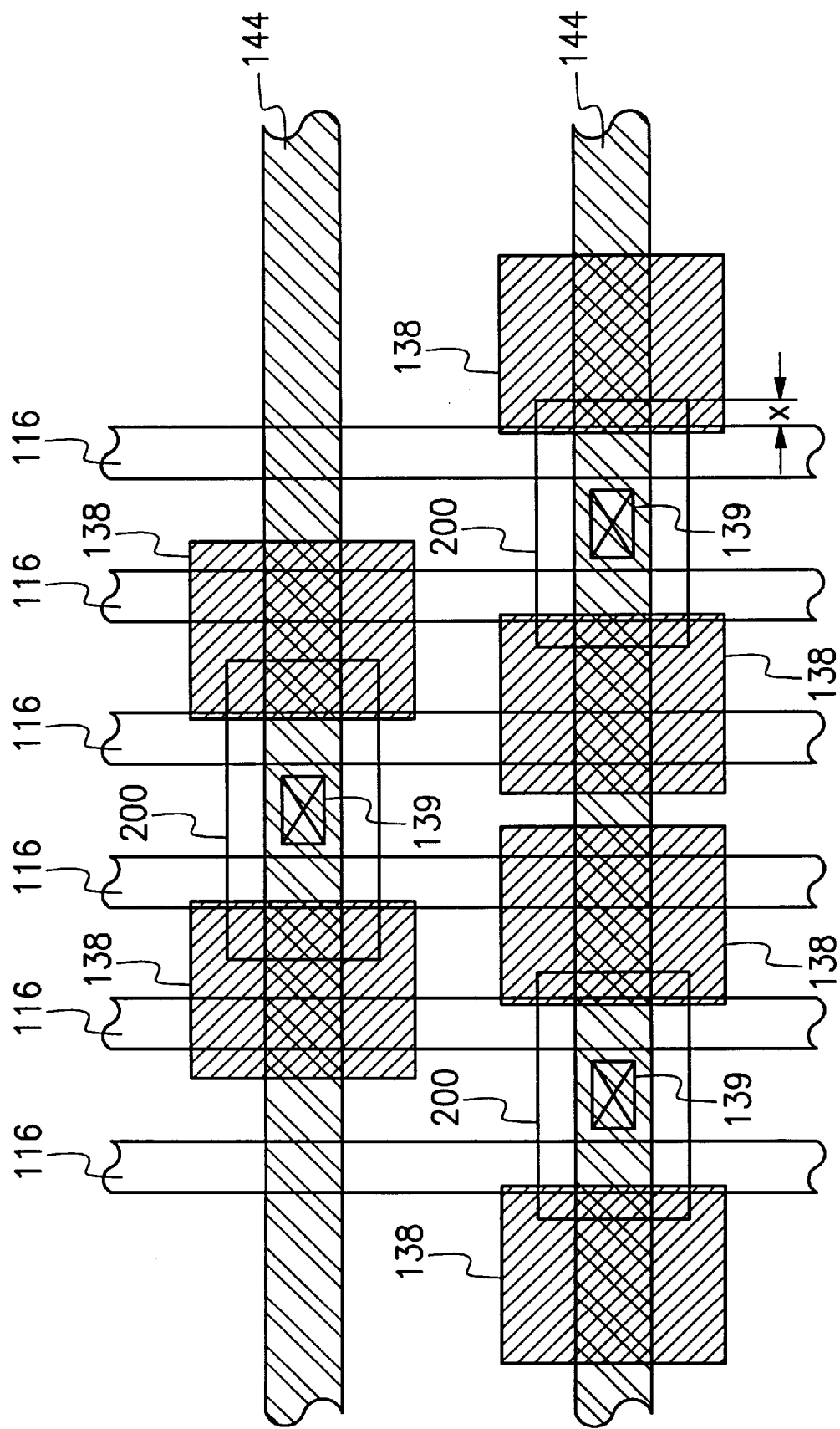
FIG. 2 is a schematic, top-view drawing of FIG. 1K.

FIG. 2 shows the top view of the structure illustrated in FIG. 1K. The layout of the active region 200 in this invention is smaller than that of the prior art due to the shrinking of the source/drain regions 122. Using the 0.2 micrometer process as an example, the overlap region of the node contact 132a of the capacitor 138 and source/drain region 122 could be shrinking down to between about 0.05 μm and about 0.1 μm. The node contact 132a of the capacitor 138 in this invention contacts not only the top surface of the source/drain region 122 but also the sidewall of the source/drain region 122. Therefore, the shrinking of the source/drain region 122 area does not affect the operation performance of the device. Moreover, with above-mentioned layout, the surface area of the storage node 132a in the trench is enhanced, so that the entire surface area in the storage node 132a of the capacitor 138 is enhanced.

This invention can be applied to not only DRAM but also to embedded DRAM.

The advantages of this invention are listed as follows:

1. The shallow isolation process and the storage node process are integrated into the fabrication of the DRAM device in this invention to simplify the DRAM process.

2. With the bit line over capacitor (BOC) structure, the capacitor is laid out in parts of the shallow trench isolation structure to increase the surface area of the storage node by using the depth of the trench. Therefore, the distance from the top of the capacitor to the surface of the substrate in this invention is smaller than that in prior art. The height difference between the memory cell region and the peripheral circuit region is reduced or does almost not exist, so that the planarization process is simplified.

3. With the method of fabricating the DRAM device of this invention, the aspect ratio of the contact opening/via opening in the peripheral circuit region can be reduced, to enhance further the reliability of metal interconnection process.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a DRAM device, comprising the steps of:

providing a substrate with a pad oxide layer and a mask layer formed thereon and forming a trench through the pad oxide layer and mask layer and into the substrate;

forming a liner oxide layer over a surface of the substrate in the trench;

forming a conformal liner layer over the liner oxide layer, wherein the conformal liner layer and the liner oxide layer are made from different materials;

forming a insulating plug in the trench;

removing parts of the conformal liner layer and the mask layer so that a distance exists between the conformal liner layer and a surface of the substrate;

forming a conformal first insulating layer, wherein the conformal first insulating layer and the conformal liner layer are made from different materials;

removing parts of the conformal first insulating layer and the pad oxide layer until the substrate is exposed;

forming a word line and two source/drain regions, wherein the word line is surrounded by an insulating material, the source/drain regions are located beside the word line in the substrate, and a depth of the source/drain regions is greater than the distance between the conformal liner layer and the surface of the substrate;

forming a conformal second insulating layer with a planarized surface over the word line;

forming a first opening and a second opening in the conformal second insulating layer to expose the source/drain regions respectively, wherein the first opening reaches a bottom of the trench;

forming a conformal third insulating layer, wherein the conformal third insulating layer and the conformal liner layer are made from different materials;

removing parts of the conformal third insulating layer until parts of the substrate is exposed;

forming a conformal first conducting layer;

forming a conformal dielectric layer over the conformal first conducting layer;

forming a conformal second conducting layer over the conformal dielectric layer to fill the first opening and the second opening;

patterning the conformal second conducting layer, the conformal dielectric layer and the conformal first conducting layer to form a capacitor corresponding to a region of the first opening, and forming a stacked plug in the second opening at the same time;

forming a conformal fourth insulating layer over the capacitor and the stacked plug;

patterning the conformal fourth insulating layer and the conformal second insulating layer to form a third opening therein to expose the conformal first conducting layer of the stacked plug; and forming a wiring line on the conformal fourth insulating layer to connect the conformal first conducting layer of the stacked plug through the third opening.

2. The method of claim 1, wherein the conformal liner layer comprises silicon nitride.

3. The method of claim 1, wherein the conformal first insulating layer, the conformal second insulating layer, the conformal third insulating layer and the conformal fourth insulating layer comprise oxide.

4. The method of claim 1, wherein the wiring line formed on the conformal fourth insulating layer comprises a bit line.

5. The method of claim 1, wherein the wiring line formed on the conformal fourth insulating layer comprises an interconnection in a peripheral circuit region in the DRAM device.

6. A method of fabricating a DRAM device, comprising the steps of:

providing a substrate with a trench formed therein, wherein a liner oxide layer is formed over a surface of the substrate in the trench, a conformal liner layer is formed over the liner oxide layer, a distance exists between the conformal liner layer and a surface of the substrate and an insulating plug is formed in the trench;

forming a word line and two source/drain regions, wherein the word line is surrounded by an insulating material, the source/drain regions are located beside the word line in the substrate, and a depth of the source/drain regions is greater than the distance between the conformal liner layer and the surface of the substrate;

forming a conformal first insulating layer with a planarized surface over the word line;

forming a first opening and a second opening in the conformal first insulating layer to expose the source/drain regions, respectively, wherein a depth of the first opening reaches a bottom of the trench;

forming a conformal second insulating layer, wherein the conformal second insulating layer and the conformal liner layer are made from different materials;

removing parts of the conformal second insulating layer until part of the substrate is exposed;

forming a conformal first conducting layer;

forming a conformal dielectric layer over the conformal first conducting layer;

forming a conformal second conducting layer over the conformal dielectric layer to fill the first opening and the second opening;

patterning the conformal second conducting layer, the conformal dielectric layer and the conformal first conducting layer to form a capacitor in the first opening, while forming a stacked plug in the second opening at the same time;

forming a conformal third insulating layer over the capacitor and the stacked plug;

patterning the conformal third insulating layer and the conformal first insulating layer to form a third opening therein to expose the conformal first conducting layer of the stacked plug; and forming a wiring line on the conformal third insulating layer to connect the conformal first conducting layer of the stacked plug through the third opening.

7. The method of claim 6, wherein the conformal liner layer comprises silicon nitride.

8. The method of claim 6, wherein the conformal first insulating layer, the conformal second insulating layer and the conformal third insulating layer comprise oxide.

9. The method of claim 6, wherein the wiring line formed on the conformal third insulating layer comprises a bit line.

10. The method of claim 6, wherein the wiring line formed on the conformal third insulating layer comprises an interconnection in a peripheral circuit region in the DRAM device.

* * * * *